United States Patent [19]
Taylor

[11] Patent Number: 5,848,101
[45] Date of Patent: Dec. 8, 1998

[54] CIRCUITS SYSTEMS AND METHODS FOR REDUCING POWER LOSS DURING TRANSFER OF DATA ACROSS AN I/O BUS

[75] Inventor: Ronald T. Taylor, Grapevine, Tex.

[73] Assignee: Cirrus Logic, Inc., Fremont, Calif.

[21] Appl. No.: 591,864

[22] Filed: Jan. 25, 1996

[51] Int. Cl.⁶ .............................. H04B 3/00; H04L 25/00; H03K 19/0175

[52] U.S. Cl. ........................... 375/257; 375/257; 326/62; 326/80; 326/81; 326/86; 326/90; 327/333

[58] Field of Search .......................... 375/257; 327/108, 327/333; 326/86, 80, 81, 90, 62; 307/270

[56] References Cited

U.S. PATENT DOCUMENTS

| | | | |
|---|---|---|---|
| 3,906,254 | 9/1975 | Lane et al. | 326/68 |
| 4,039,862 | 8/1977 | Dingwall et al. | 327/333 |
| 4,450,371 | 5/1984 | Bismarck | 307/475 |
| 4,486,670 | 12/1984 | Chan et al. | 307/264 |
| 4,605,864 | 8/1986 | Varadarajan et al. | 326/75 |
| 4,730,131 | 3/1988 | Sauer | 307/443 |
| 4,914,318 | 4/1990 | Allen | 307/272.2 |
| 4,943,740 | 7/1990 | Gulczynski | 307/443 |
| 4,978,870 | 12/1990 | Chen et al. | 307/475 |
| 5,012,129 | 4/1991 | Basten | 327/108 |
| 5,132,560 | 7/1992 | Kane | 327/55 |
| 5,165,054 | 11/1992 | Platt et al. | 330/277 |
| 5,250,856 | 10/1993 | Burton et al. | 326/110 |
| 5,285,115 | 2/1994 | Tsuji | 307/362 |
| 5,329,171 | 7/1994 | Shimiz et al. | 307/354 |
| 5,369,319 | 11/1994 | Good et al. | 327/73 |
| 5,399,913 | 3/1995 | Widener et al. | 327/108 |
| 5,530,392 | 6/1996 | Runas et al. | 327/333 |
| 5,585,744 | 12/1996 | Runas et al. | 326/86 |
| 5,596,291 | 1/1997 | Runas | 327/108 |
| 5,644,255 | 7/1997 | Taylor | 326/81 |
| 5,764,082 | 6/1998 | Taylor | 326/81 |

*Primary Examiner*—Stephen Chin
*Assistant Examiner*—Michael W. Maddox
*Attorney, Agent, or Firm*—James Murphy; Steven A. Shaw

[57] ABSTRACT

A system is provided for transferring information across a conductor 203. Transmitting circuitry 210 receives information in the form of a first signal having a first voltage swing and, in response, outputs a second signal having a second voltage swing. The first voltage swing is between a first high voltage and a first low voltage and the second voltage swing is between a second high voltage less than the first high voltage and a second low voltage greater than the first low voltage. The second high voltage is substantially equal to a voltage level of a first voltage rail to which the transmitting circuitry 210 is coupled and the second low voltage is substantially equal to a voltage level of a second voltage rail to which the transmitting circuitry 210 is coupled. The conductor 203 carries the second signal output from the transmitting circuitry 210. Receiving circuitry 212 receives the second signal output from the transmitting circuitry 210 via the conductor 203 and, in response, outputs a signal having the first voltage swing.

20 Claims, 1 Drawing Sheet

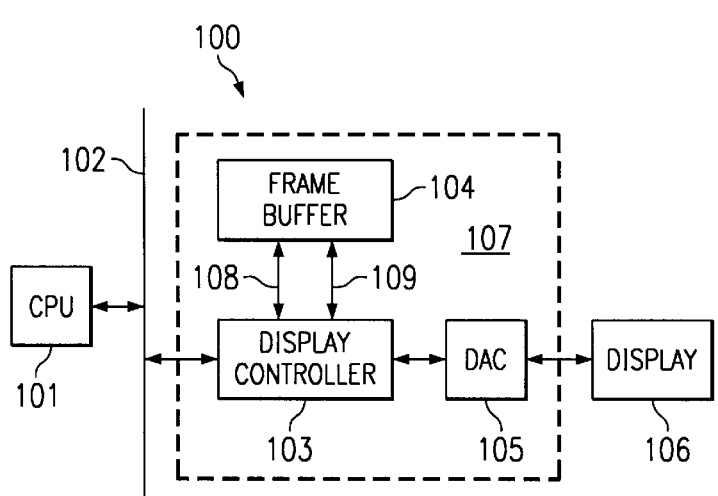
FIG. 1
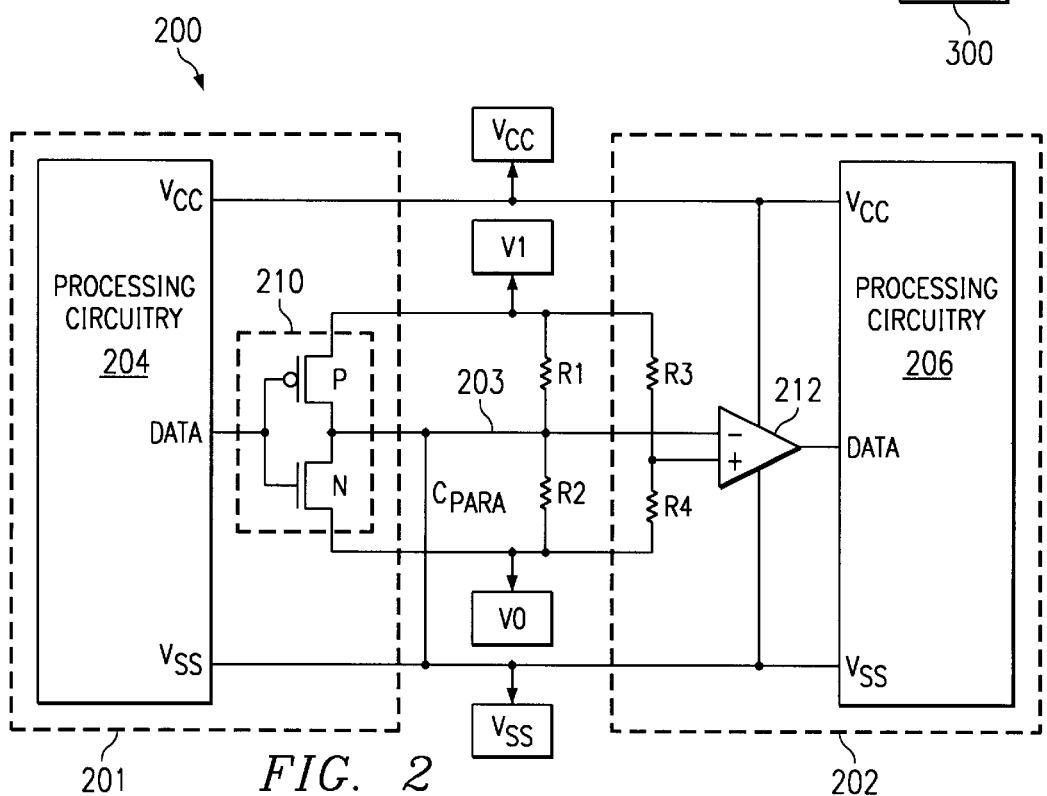
FIG. 3
FIG. 2

CIRCUITS SYSTEMS AND METHODS FOR REDUCING POWER LOSS DURING TRANSFER OF DATA ACROSS AN I/O BUS

CROSS-REFERENCE TO RELATED APPLICATIONS

The following co-pending and co-assigned United States Patent Applications contain related information and are incorporated herein by reference:

CIRCUITS, SYSTEMS AND METHODS FOR THE HIGH SPEED TRANSFER OF DATA ACROSS A CONDUCTIVE LINE, U.S. patent application Ser. No. 08/418,649, filed on Apr. 10, 1995 now abandoned;

CIRCUITS, SYSTEMS AND METHODS FOR REDUCING POWER LOSS DURING TRANSFER OF DATA ACROSS A CONDUCTIVE LINE, U.S. patent application Ser. No. 08/543,210, filed on Oct. 13, 1995 now U.S. Pat. No. 5,585,744.

TECHNICAL FIELD OF THE INVENTION

The present invention relates in general to is electronic circuits and systems and, in particular, to circuits, systems and methods for reducing power loss during transfer of data across a conductive line.

BACKGROUND OF THE INVENTION

In designing high performance integrated circuits, the need to transfer addresses and data across a bus at high speed is a critical consideration. This is especially true in applications where a memory circuit and a high performance state machine are coupled by a common bus. One such instance is the bus between a display controller and a frame buffer memory. In this case, substantial amounts of data, and the corresponding addresses, must be transferred between the graphics controller and the frame buffer at rates high enough to support display refresh and update, and other processing operations, such as filtering. As display systems with increased resolution and bit depths are developed, the rate at which data must be transferred between the controller and the frame buffer consequently increases. While some of the necessary bandwidth can be achieved by using wider buses, improvement in the speed at which data is transferred over the individual bus lines is still required.

The lines of a typical PC board bus are long, thin conductors which extend relatively substantial lengths across the face of an insulating substrate, the substrate spacing each conductor from a ground plane and from other signal wires. As a result of this configuration, each line presents a significant capacitance which must be charged or discharged by a bus driver or similar circuit during data transmission. The result is substantial power consumption, particularly when a CMOS or TTL bus is driven between positive and negative power supply rails.

The power consumption resulting from parasitic bus line capacitance increases directly with the data transmission rate across the bus, since $P=CV^2f$, where P is the power loss through each conductor, V is the voltage applied, C is the capacitance of the conductor, and f is the frequency at which the conductor is charged/discharged. It should also be noted that some additional small power consumption results from the resistance of each bus line.

It is possible to reduce power consumption by reducing the capacitance of the bus lines themselves. This option, however, requires that the fabrication process for chips and for circuit boards be modified; a change in process to reduce line capacitance is expensive and may adversely effect the fabrication of other circuitry on chips and boards. Another option is to reduce the frequency at which data is transferred across the bus. Assuming that the width of the bus is not increased, this option simply trades off system performance for power reduction, an option which usually is not viable in the design and implementation of high performance circuits.

Thus, the need has arisen for improved circuits, systems and methods for transferring data and/or addresses across the lines of a bus at high rates. Such circuits, systems and methods should advantageously minimize power consumption and the problems attendant therewith. In particular, such circuits, systems and methods should be applicable to high performance integrated circuit applications, such as display controllers and semiconductor memories. Finally, such circuits, systems and methods should require neither expensive and complicated changes to the chip fabrication process nor a reduction in system performance for implementation.

SUMMARY OF THE INVENTION

According to one embodiment of the present invention, a system is provided for transferring information comprising transmitting circuitry for receiving information in the form of a first signal having a first voltage swing and, in response, outputting a second signal having a second voltage swing, the first voltage swing being between a first high voltage and a first low voltage and the second voltage swing being between a second high voltage less than the first high voltage and a second low voltage greater than the first low voltage. The second high voltage is substantially equal to a voltage level of a first voltage rail to which the transmitting circuitry is coupled and the second low voltage is substantially equal to a voltage level of a second voltage rail to which the transmitting circuitry is coupled. The system further comprises a conductor for carrying the second signal output from the transmitting circuitry and receiving circuitry for receiving the second signal output from the transmitting circuitry via the conductor and, in response, outputting a signal having the first voltage swing.

According to another embodiment of the present invention, a system is provided for transferring data across a data line comprising a first integrated circuit for transmitting data across the data line, the first integrated circuit comprising processing circuitry coupled to a first high voltage rail and a first low voltage rail, the processing circuitry generating a first data signal having a first voltage swing between a first high voltage level substantially equal to a voltage level of the first high voltage rail and a first low voltage level substantially equal to a voltage level of the first low voltage rail. The first integrated circuit further comprises a line driver coupled to a second high voltage rail and a second low voltage rail, the line driver receiving the first data signal from the processing circuitry and outputting on the data line a second data signal having a second voltage swing between a second high voltage level substantially equal to a voltage level of the second high voltage rail and a second low voltage level substantially equal to a voltage level of the second low voltage rail, wherein the second high voltage level is less than the first high voltage level and the second low voltage level is greater than the first low voltage level. The system further comprises a second integrated circuit coupled to the data line comprising a receiver for receiving the second data signal transmitted at the second voltage swing, the receiver outputting data at substantially the first voltage swing.

According to still another embodiment of the present invention, an integrated circuit is provided for transmitting data across at least one data line, the integrated circuit comprising processing circuitry operating between a first high voltage rail having a voltage level of $V_{CC}$ and a first low voltage rail having a voltage level of $V_{SS}$, the processing circuitry generating at least one full-swing data signal having a first voltage swing between a logic high level substantially equal to $V_{CC}$ and a logic low level substantially equal to $V_{SS}$. The integrated circuit further comprises at least one line driver operating between a second high voltage rail having a voltage level of V1, wherein V1 is less than $V_{CC}$, and a second low voltage rail having a voltage level of V0, wherein V0 is greater than $V_{SS}$, the at least one line driver receiving the at least one full-swing data signal from the processing circuitry and outputting on the at least one data line at least one reduced-swing data signal having a second voltage swing between a logic high level substantially equal to V1 and a logic low level substantially equal to V0.

The foregoing has outlined rather broadly the features and technical advantages of the present invention in order that the detailed description of the bus line driver circuit that follows may be better understood. Additional features and advantages of the bus line driver circuit will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 is a functional block diagram of a display control system;

FIG. 2 is an electrical schematic diagram of bus line driver/receiver circuitry embodying the principles of the present invention, the circuitry of FIG. 2 suitable in one application for transferring data and addresses across the address and data buses coupling the display controller and frame buffer of the system illustrated in FIG. 1; and FIG. 3 is a pin configuration of an integrated circuit package embodying the teachings of the present invention.

DETAILED DESCRIPTION OF THE INVENTION

The principles of the present invention and their advantages are best understood by referring to the illustrated embodiment depicted in FIGS. 1–3 of the drawings, in which like numbers designate like parts. For purposes of illustration, the principles of the present invention will be described as if implemented in a display system frame buffer, although these principles may be applied to a number of different data processing circuits and systems, as will become apparent from the discussion below.

FIG. 1 is a high level functional block diagram of the portion of a processing system 100 controlling the display of graphics and/or video data. System 100 includes a central processing unit (CPU) 101, a system bus 102, a display controller 103, a frame buffer 104, a digital to analog converter (DAC) 105 and a display device 106. Display controller 103, frame buffer 104 and DAC 105 may be fabricated together on a single integrated circuit chip 107 or on separate chips. Display controller 103 and frame buffer 104 are coupled by an address bus 108 and an associated data bus 109 constructed in accordance with the principles of the present invention.

CPU ("master") 101 controls the overall operation of system 100, determines the content of graphics data to be displayed on display unit 106 under user commands, and performs various data processing functions. CPU 101 may be, for example, a general purpose microprocessor used in commercial personal computers. CPU 101 communicates with the remainder of system 100 via CPU bus 102, which may be, for example, a local bus, an ISA bus or a PCI bus. DAC 105 receives digital data from display controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device which displays images on a display screen as a plurality of pixels. It should also be noted that in alternate embodiments, "display" 106 may be another type of output device such as a laser printer or similar document view/print appliance.

FIG. 2 is an electrical schematic diagram of bus driver/receiver circuitry 200 for transferring data and addresses from a first integrated circuit (IC) 201 to a second integrated circuit (IC) 202 across a transmission line, such as a given line 203 of address bus 108 or data bus 109. It should be noted that in the illustrative embodiment, integrated circuit to integrated circuit data transfers are being described for exemplary purposes. In alternate embodiments of the principles of the present invention, substantially all of the circuits of driver/receiver circuitry 200 may be co-located on a single chip to implement on-chip transfers.

IC 201 contains processing circuitry 204 that generates the signal DATA that is to be sent to processing circuitry 206 in IC 202 (the nomenclature DATA is used herein to identify the signal being transferred across bus line 203, although that signal may be either data or addresses). It should be noted that in system 100, driver/receiver circuitry 200 could also be applied to the transfer of data and/or addresses between bus 102 and display controller 103, between display controller 103 and DAC 105, or between DAC 105 and display 106, to name only a few examples.

In FIG. 2, selected bus line 203 is assumed to be unidirectional for discussion purposes. In other embodiments, bus line 203 could be bi-directional. Also, for discussion purposes, line driver 210, a standard CMOS inverter, is shown driving an output load represented by resistors R1–R4 and comparator 212. It should be understood, however, that other output loads may be used and that other types of line drivers, such as non-inverting line drivers, may also be used. The capacitive loading of bus line 203 is represented by the parasitic capacitance $C_{para}$, discussed further below.

Processing circuitry 204 and processing circuitry 206 operate between voltage rails of $V_{CC}$ and $V_{SS}$. Processing circuitry 204 may, for example, be processing circuitry within display controller 103 and processing circuitry 206 may be input/output circuitry of frame buffer 104. For a CMOS embodiment, $V_{CC}$ is typically in the range of +3.3V to +5V and $V_{SS}$ is typically 0V. For discussion purposes, it will be assumed that $V_{CC}$ is 3.3V and $V_{SS}$ is 0V for the remainder of this disclosure. It should be understood, however, that such operating parameters and device parameters are merely illustrative and a wide range of other parameter values may be used without departing from the spirit and scope of the present invention.

In the illustrated embodiment, data is transmitted across bus line 203 using line driver 210, which is a CMOS inverter that includes a p-channel transistor and an n-channel transistor. Unlike processing circuitry 204, however, line driver 210 operates between voltage rails of V1 and V0, where $V_{CC}>V1>V0>V_{SS}$. The signal names "V1" and "V0" denote V(Logic 1) and V(Logic 0), respectively. V1 and V0 are external voltage supply levels that represent the Logic 1 and Logic 0 voltage levels that are transmitted across bus line 203. As the signal DATA switches from Logic 1=3.3V to Logic 0=0V, the voltage swing on bus line 203, which is coupled to the drains of the p-channel and n-channel transistors in line driver 210, is limited to the values of the supply rails V1 and V0, which are connected to the sources of the p-channel and n-channel transistors, respectively.

For example, if $V_{CC}$=3.3V and $V_{SS}$=0V, V1 is selected to be $V_{CC}/2+0.4$=2.05V, and V0 is selected to be $V_{CC}/2-0.4$=1.25V, then the peak-to-peak voltage swing on bus line 203 is (2.05−1.25)=$0.8V_{pp}$. This reduced voltage swing on bus line 203 reduces power loss due to the parasitic capacitance, $C_{para}$, of bus line 203, by reducing the voltage component, V, in the power loss equation P=$CV^2f$.

Bus line 203 is coupled to the inverting input of comparator 212 in IC 202. During transmission of signal DATA, comparator 212 compares the voltage on bus line 203 with a reference voltage determined by the voltage divider of resistors R3 and R4 (i.e., [R4/(R3+R4)]×(V1−V0)). When no data is being transmitted, bus line 203 is "floating" at a DC bias voltage determined by the voltage divider of R1 and R2 (i.e., [R2/(R1+R2)]×(V1−V0)). In the illustrative chip-to-chip transmission embodiment, R1 and R2 are resistors in the PC board. In a preferred embodiment invention, R1=R2 and R3=R4, V1=$V_{CC}/2+\Delta V$ and V2=$V_{CC}/2-\Delta V$, so that the R3–R4 voltage divider reference is $V_{CC}/2$ and the DC bias voltage level on bus line 203 is also $V_{CC}/2$. R1 and R2 may be omitted, but initial switching speeds are improved when data is first transmitted if R1 and R2 are used to set the DC bias level close to $V_{CC}/2$. In an alternate embodiment of the present invention, R3 and R4 may be connected to $V_{CC}$ and $V_{SS}$, respectively, rather than V1 and V0, and the voltage reference on the non-inverting input of comparator 212 will remain $V_{CC}/2$, provided R3 and R4 are equal.

Comparator 212 is coupled to the $V_{CC}$ and $V_{SS}$ supply rails so that the output signal, DATA, of comparator 212 is returned to a full voltage swing between $V_{CC}$ and $V_{SS}$. Thus, when the voltage on bus line 203 falls below $V_{CC}/2$ (e.g., 1.25V), the voltage on the inverting input of comparator 212 is less than the reference voltage, $V_{CC}/2$, on the non-inverting input and the output of comparator 212 goes high to $V_{CC}$. Similarly, when the voltage on bus line 203 rises above $V_{CC}/2$ (e.g., 2.05V), the voltage on the inverting input of comparator 212 is greater than the reference voltage, $V_{CC}/2$, on the non-inverting input, and the output of comparator 212 goes low to $V_{SS}$=0V.

In recent years, the number of bits that simultaneously are written into or read from an integrated circuit package has greatly increased. For example, 4 MBit DRAM memories that were typically configured as 1 Mword×4 bit devices in 1-pin DQ (data) port packages are now available as 256 Kword×16 bit devices in 16-pin DQ port packages. Consequently, the number of data line drivers per package is expanded from one line to sixteen. Furthermore, IC packages are now available that have 32-bit and 64-bit DQ ports. Since the amount of current drawn by each line driver is relatively large compared to the current drawn by the other processing circuits and/or storage elements in the IC, the total amount of current drawn by the IC increases significantly. This, in turn, has caused the inductive noise on the power supply pins of ICs having large pin-outs buses to become unacceptable.

In the past, this problem was overcome by simply adding more power supply pins to reduce the inductive noise on each pin, although the total power consumption would remain unchanged. The present invention provides for significant power consumption reduction by reducing from $V_{CC}$ and increasing above $V_{SS}$ the voltage applied to some of these pins. At least some of these power supply pins can be used to input voltages V0 and V1 to bus drivers 210 and/or receivers 212.

FIG. 3 is a pin configuration of an integrated circuit package according to the present invention. IC 300 contains processing circuitry that operates between the externally-supplied rail voltages $V_{CC}$ (pins 1, 26) and $V_{SS}$ (pins 27, 52). IC 300 also contains bus line drivers that operate between the externally-supplied "reduced swing" rail voltages V1 (pins 8, 14, 20, 33, 39, and 45) and V0 (pins 9, 15, 21, 32, 38, and 44). In an integrated circuit according to the prior art, all power pins on IC 300 would either be $V_{CC}$ or $V_{SS}$ (ground).

IC 300 is an illustrative package and the signal names, IO00–IO31, are mere "generic" names for the signals appearing on a plurality of bus lines similar to bus line 203. The signals IO00–IO31 may, in fact, be data lines or address lines. Likewise, the signal names CNT0–CNT3 are generic names for control signals. For example, in a memory circuit, the control signals CNT0–CNT3 may be OE (Output Enable), R/W* (Read/Write), RAS (Row Address Strobe) and CAS (Column Address Strobe) and the signals IO00–IO31 may be address lines ADDR00-ADDR15 and data lines D00–D15. Each of the I/O pins IO00–IO31 in IC 300 is driven by a line driver operating between the voltage rails V1 and V0, such as line driver 210 in FIG. 2. Bi-directional pins are also coupled to an input receiver stage, such as comparator 212 and resistors R3 and R4.

Using different power supply levels to provide power to the bus line driver/receiver circuitry offers several advantages over the prior art. While the processing circuitry in IC 201 and IC 202 continues to operate between $V_{CC}$=3.3V and 0V, the line drivers, which represent a significant portion of the total power consumed by each integrated circuit, operate at a reduced voltage swing between V1 (e.g., 2.05V) and V0 (e.g., 1.25V). Since V1 and V0 are externally supplied, a system designer can tailor the peak-to-peak voltage swing according to system noise and power requirements. R1 and R2 may also be selected to set the D.C. bias of bus line 203 at $V_{CC}/2$ or at some other level, according to system noise and power requirements.

Although the present invention and its advantages have been described in detail, it should be understood that various changes, substitutions and alterations can be made herein without departing from the spirit and scope of the invention as defined by the appended claims.

What is claimed is:

1. A system for transferring information comprising:
    transmitting circuitry for receiving information in the form of a first signal having a first voltage swing and, in response, outputting a second signal having a second voltage swing, said first voltage swing being between a first high voltage—driven from a first high voltage rail—and a first low voltage—driven from a low first voltage rail—and said second voltage swing being between a second high voltage less than said first high voltage and a second low voltage greater than said first low voltage, wherein said second high voltage is substantially equal to a voltage level of a—second high—voltage rail to which said transmitting circuitry is coupled and said second low voltage is substantially equal to a voltage level of a second—low—voltage rail to which said transmitting circuitry is coupled;

a conductor for carrying said second signal output from said transmitting circuitry; and receiving circuitry for receiving said second signal output from said transmitting circuitry via said conductor and, in response, outputting a signal having said first voltage swing.

2. The system as set forth in claim 1 wherein said transmitter circuitry comprises line driver circuitry.

3. The system as set forth in claim 2 wherein said line driver circuitry comprises an inverting driver.

4. The system as set forth in claim 1 wherein said receiver circuitry comprises comparator circuitry.

5. The system as set forth in claim 1 wherein said transmitting circuitry is fabricated on a first integrated circuit chip and said receiving circuitry is fabricated on a second integrated circuit chip.

6. A system for transferring a signal across a line comprising:

first circuitry for transmitting a signal across said line, said first circuitry comprising:

processing circuitry coupled to a first high voltage rail and a first low voltage rail, said processing circuitry generating a first signal having a first voltage swing between a first high voltage level substantially equal to a voltage level of said first high voltage rail and a first low voltage level substantially equal to a voltage level of said first low voltage rail; and a line driver coupled to a second high voltage rail and a second low voltage rail, said line driver receiving said first signal from said processing circuitry and outputting on said line a second signal having a second voltage swing between a second high voltage level substantially equal to a voltage level of said second high voltage rail and a second low voltage level substantially equal to a voltage level of said second low voltage rail, wherein said second high voltage level is less than said first high voltage level and said second low voltage level is greater than said first low voltage level; and second circuitry coupled to said line comprising a receiver for receiving said second signal transmitted at said second voltage swing, said receiver outputting a third signal at substantially said first voltage swing.

7. The system as set forth in claim 6 wherein a voltage level midway between said first high voltage level and said first low voltage level is substantially equal to a voltage level midway between said second high voltage level and said second low voltage level.

8. The system as set forth in claim 6 further comprising:

a first resistor having a first terminal coupled to said line and a second terminal coupled to said second high voltage rail; and a second resistor having a first terminal coupled to said line and a second terminal coupled to said second low voltage rail, said first and second resistors establishing a DC bias voltage on said line.

9. The system as set forth in claim 8 wherein said DC bias voltage is approximately midway between said second high voltage level and said second low voltage level.

10. The system as set forth in claim 6 further comprising a first resistor having a first terminal coupled to said line and a second terminal coupled to said second high voltage rail and a second resistor having a first terminal coupled to said line and a second terminal coupled to said second low voltage rail, said first and second resistors establishing a DC bias voltage on said line.

11. The system as set forth in claim 10 wherein said DC bias voltage is approximately midway between said second high voltage level and said second low voltage level.

12. The system as set forth in claim 6 wherein said line comprises one of a plurality of signal lines forming a bus.

13. The system as set forth in claim 6 wherein said first high voltage rail is connected to a first terminal of a first external voltage source and said first low voltage rail is connected to a second terminal of said first external voltage source.

14. The system as set forth in claim 13 wherein said second high voltage rail is connected to a first terminal of a second external voltage source and said second low voltage rail is connected to a second terminal of said second external voltage source.

15. An integrated circuit for transmitting a signal across at least one conductive line, said integrated circuit comprising:

processing circuitry operating between a first high voltage rail having a voltage level of $V_{CC}$ and a first low voltage rail having a voltage level of $V_{SS}$, said processing circuitry generating at least one signal having a first voltage swing between a logic high level substantially equal to $V_{CC}$ and a logic low level substantially equal to $V_{SS}$; and at least one line driver operating between a second high voltage rail having a voltage level of V1, wherein V1 is less than $V_{CC}$, and a second low voltage rail having a voltage level of V0, wherein V0 is greater than $V_{SS}$, said at least one line driver receiving said at least one signal from said processing circuitry and outputting on said at least one conductive line at least one signal having a second voltage swing between a logic high level substantially equal to V1 and a logic low level substantially equal to V0.

16. The integrated circuit as set forth in claim 15 wherein said first high voltage rail is connected to a first terminal of a first external voltage source and said first low voltage rail is connected to a second terminal of said first external voltage source.

17. The integrated circuit as set forth in claim 16 wherein said second high voltage rail is connected to a first terminal of a second external voltage source and said second low voltage rail is connected to a second terminal of said second external voltage source.

18. The integrated circuit as set forth in claim 16 wherein a voltage level midway between $V_{CC}$ and $V_{SS}$ is substantially equal to a voltage level midway between V1 and V0.

19. A method of transferring information across a conductor comprising the steps of:

converting information in the form of a first signal having a first voltage swing into a second signal having a second voltage swing, the first voltage swing being between a first high voltage—provided by a first high voltage rail—and a first low voltage—provided by a first low voltage rail—and the second voltage swing being between a second high voltage—provided by a second high voltage rail—and a second low voltage—provided by a second low voltage rail—, the second high voltage being less than the first high voltage and the second low voltage being greater than the first low voltage;

transmitting the second signal on the conductor;

receiving the second signal from the conductor; and reconverting the second signal into the first signal having the first voltage swing.

20. The method of claim 19 and further comprising a step of biasing the conductor.

\* \* \* \* \*